US012665284B2

(12) United States Patent
Day

(10) Patent No.: US 12,665,284 B2
(45) Date of Patent: Jun. 23, 2026

(54) GLAZING HAVING A CONDUCTIVE COATING AND A DATA TRANSMISSION WINDOW, METHOD OF MANUFACTURING THE SAME AND USE OF THE SAME

(71) Applicant: PILKINGTON GROUP LIMITED, Lancashire (GB)

(72) Inventor: Stephen Roland Day, Wigan (GB)

(73) Assignee: Pilkington Group Limited, Nr. Ormskirk (GB)

( * ) Notice: Subject to any disclaimer, the term of this patent is extended or adjusted under 35 U.S.C. 154(b) by 144 days.

(21) Appl. No.: 18/688,505

(22) PCT Filed: Aug. 26, 2022

(86) PCT No.: PCT/GB2022/052207
§ 371 (c)(1),
(2) Date: Mar. 1, 2024

(87) PCT Pub. No.: WO2023/031590
PCT Pub. Date: Mar. 9, 2023

(65) Prior Publication Data
US 2024/0396203 A1     Nov. 28, 2024

(30) Foreign Application Priority Data
Sep. 1, 2021     (GB) ...................................... 2112472

(51) Int. Cl.
*H01Q 1/12* (2006.01)
*C03C 17/245* (2006.01)
(Continued)

(52) U.S. Cl.
CPC ....... *H01Q 1/1278* (2013.01); *C03C 17/2453* (2013.01); *C23C 16/407* (2013.01);
(Continued)

(58) Field of Classification Search
CPC ........... C03C 17/2453; C03C 2217/211; C03C 2218/1525; C03C 2218/328;
(Continued)

(56) References Cited

U.S. PATENT DOCUMENTS

| 6,275,157 B1 | 8/2001 | Mays et al. |
| 6,356,236 B1 | 3/2002 | Maeuser et al. |

(Continued)

FOREIGN PATENT DOCUMENTS

| EP | 1442497 A1 | 8/2004 |
| WO | 2020048677 A1 | 3/2020 |

OTHER PUBLICATIONS

International Search Report (PCT/ISA/210) and Written Opinion (PCT/ISA/237) mailed on Nov. 24, 2022, by the European Patent Office as the International Searching Authority for International Application No. PCT/GB2022/052207. (12 pages).

(Continued)

*Primary Examiner* — Thien M Le

(74) *Attorney, Agent, or Firm* — BUCHANAN INGERSOLL & ROONEY PC

(57) ABSTRACT

The invention concerns a glazing, comprising a pane of glass, a conductive coating on a surface of the pane of glass, a data transmission window in or adjacent the conductive coating, wherein the data transmission window is at least partly coating-free, wherein the data transmission window comprises, a rectangular portion having a shorter edge and a longer edge; and a protrusion from the shorter edge or the longer edge, wherein the protrusion comprises an axial portion having an axis parallel with the longer edge. A method for manufacturing the glazing and use of the glazing for example as window of a motor vehicle is also claimed.

(Continued)

The invention is suitable for radio frequency identification transponders operating for example in the UHF frequency band.

20 Claims, 6 Drawing Sheets

(51) Int. Cl.
  *C23C 16/40*          (2006.01)
  *H01Q 1/22*           (2006.01)
(52) U.S. Cl.
  CPC ..... *H01Q 1/2225* (2013.01); *C03C 2217/211*
    (2013.01); *C03C 2218/1525* (2013.01); *C03C*
    *2218/328* (2013.01)
(58) Field of Classification Search
  CPC .. C23C 16/407; H01Q 1/1271; H01Q 1/1278;
    H01Q 1/2225; H01Q 1/52; H01Q
    15/0006
  See application file for complete search history.

(56)                References Cited

U.S. PATENT DOCUMENTS

| | | | | |
|---|---|---|---|---|
| 10,659,140 | B2 * | 5/2020 | Lilja | ........................ H01Q 1/44 |
| 11,564,027 | B1 * | 1/2023 | Hawk | .................... H01Q 17/00 |

| | | | | |
|---|---|---|---|---|
| 2003/0080909 | A1 | 5/2003 | Voeltzel | |
| 2004/0107641 | A1 | 6/2004 | Walton et al. | |
| 2006/0152421 | A1 * | 7/2006 | Baranski | ................ H01Q 13/10 |
| | | | | 343/704 |
| 2012/0098715 | A1 * | 4/2012 | Dai | ...................... H01Q 1/1285 |
| | | | | 343/712 |
| 2012/0098716 | A1 * | 4/2012 | Dai | ...................... H01Q 1/1271 |
| | | | | 343/713 |
| 2016/0009592 | A1 | 1/2016 | Arslan et al. | |
| 2018/0111448 | A1 | 4/2018 | Rousselet et al. | |
| 2020/0321703 | A1 | 10/2020 | Lilja | |
| 2020/0328493 | A1 * | 10/2020 | Javaid | ...................... B60J 7/043 |
| 2020/0411001 | A1 * | 12/2020 | Ennen | ................... H04L 12/282 |
| 2021/0256230 | A1 | 8/2021 | Holtstiege et al. | |
| 2022/0127189 | A1 * | 4/2022 | Radu | ................... C03C 23/0025 |
| 2022/0200156 | A1 * | 6/2022 | Sonoda | ................ H01Q 19/062 |
| 2022/0324204 | A1 * | 10/2022 | Legois | .................. H01Q 5/357 |
| 2025/0055173 | A1 * | 2/2025 | Thangamani | ....... B32B 17/1022 |

OTHER PUBLICATIONS

Great Britain Search Report for Application No. GB 2112472.2 dated Jun. 10, 2022.

* cited by examiner

GLAZING HAVING A CONDUCTIVE COATING AND A DATA TRANSMISSION WINDOW, METHOD OF MANUFACTURING THE SAME AND USE OF THE SAME

FIELD OF THE INVENTION

The invention is a glazing comprising a conductive coating and a data transmission window, a method of manufacturing the same and use of the same.

BACKGROUND OF THE INVENTION

Glazings having a conductive coating and a data transmission window are known. The conductive coating may be for thermal insulation by infrared reflection or for electric heating. The data transmission window allows radio frequency (RF) communication, for example to or from a transmitter-responder (transponder) on or in the glazing.

Radio Frequency Identification (RFID) is a non-contact automatic identification technology using RF communication. An RFID transponder comprising an antenna and a RF chip may be positioned on or in a vehicle window. RFID transponders may be used for highway automatic toll collection, traffic management and car theft prevention.

U.S. Pat. No. 6,275,157B1 (Mays) discloses a vehicle windshield having an RFID transponder operating at 915 MHz. The windshield has a conductive film for thermal insulation, having a clear space where conductive material is selectively removed. The RFID transponder is disposed in the clear space.

US2004107641A1 (Walton) discloses a window of a vehicle having a metallic panel for heating or infrared radiation and an automatic toll collection transponder. An aperture having multiple openings is formed in the metallic panel. Spacing and size of the openings vary across the aperture to enable sidelobe control.

WO2020048677A1 (Holtstiege) discloses a vehicle window having an RFID transponder operating in a range from 800 MHZ to 3 GHz and a conductive coating. The RFID transponder is arranged preferably centrally in a coating-free area of the window.

There remains a need for a glazing having a conductive coating and an improved antenna performance.

OBJECTIVES OF THE INVENTION

A first objective of the invention is to provide a glazing having improved RF communication. A second objective is to provide a simple method of manufacturing said glazing. A third objective is to provide a glazing which, in use as a vehicle window, has improved RF communication.

SUMMARY OF THE INVENTION

In a first aspect, the present invention provides a glazing comprising the features set out in claim 1.

The invention provides a glazing for electric heating, solar control, or control of IR solar heating, comprising a pane of glass; a conductive coating arranged on a surface of the pane of glass; a data transmission window in or adjacent the conductive coating; wherein the data transmission window is at least partly coating-free; wherein the data transmission window comprises a rectangular portion having a longer edge and a shorter edge; and a protrusion from the longer edge or the shorter edge; wherein the protrusion comprises an axial portion having an axis parallel with the longer edge; wherein the protrusion and the axial portion are coating-free; and wherein the rectangular portion comprises a plurality of horizontal coating-free lines having a spacing and a plurality of vertical coating-free lines having the same spacing to form a plurality of coated squares or a different spacing to form a plurality of coated rectangles; wherein the spacing is chosen to allow transmission at a predetermined frequency through the data transmission window; and wherein the spacing is less than or equal to one tenth of a wavelength corresponding to the predetermined frequency multiplied by a shortening factor for the pane of glass; and wherein at least a section of the axial portion has a predetermined length greater than or equal to one sixth of a wavelength of the predetermined frequency multiplied by a shortening factor for the pane of glass.

With regard to the prior art, it was not inferable by the person skilled in the art that the object of the present invention could be achieved using the glazing according to the invention, the method according to the invention and the use according to the invention. Surprisingly, a protrusion having an axial portion parallel with the longer edge improves RF communication through the data transmission window for an RFID transponder located adjacent thereto.

The inventor has found that a protrusion having an axial portion parallel with the longer edge limits electric currents induced around the data transmission window.

The invention provides a glazing to meet industrial test requirements for RF communication, for example for data transmission through a vehicle window.

The pane of glass is preferably soda lime silica glass, manufactured using the float process. Glass thickness is preferably in a range from 2 to 12 mm. The pane of glass may be toughened glass or annealed glass. The pane of glass may be monolithic or laminated to another pane of glass having between them a ply of interlayer material, preferably polyvinyl butyral (PVB) to bond them together.

Preferably, the conductive coating is spaced inward from the periphery of the pane of glass to prevent water contacting the conductive coating at the periphery and so avoid corrosion of the conductive coating by water. Preferably, a coating-free peripheral region width is in a range from 5 mm to 25 mm, more preferably from 10 mm to 20 mm.

Preferably, the axis of the axial portion is parallel with the longer edge within an angular tolerance from −30 degrees to +30 degrees, more preferably from −15 degrees to +15 degrees, most preferably from −5 degrees to +5 degrees.

Preferably, the glazing comprises a plurality of protrusions.

Preferably, the protrusions or plurality of protrusions is coating-free.

Preferably, the protrusion or any of the plurality of protrusions has a shape selected from rectangular, triangular, arcuate, linear, bent line, straight line, or combinations thereof.

Preferably, each protrusion of the plurality of protrusions comprises a respective axial portion each having an axis parallel with the longer edge.

Preferably, a protrusion has two axial portions. Preferably, two protrusions are from the shorter edge. Preferably, a protrusion is from the shorter edge adjacent a corner with the longer edge.

Preferably, the axial portion or the plurality of axial portions is coating-free.

Preferably, the axial portion or each of the plurality of axial portions is shaped as a straight line or a rectangle.

Preferably, the axial portion or the plurality of axial portions each have width in a range from 10 μm to 5 mm, more preferably from 20 μm to 4 mm, most preferably from 30 μm to 200 μm.

Preferably, the conductive coating comprises a layer of a transparent conductive oxide, preferably a doped transparent conductive oxide, more preferably fluorine doped tin oxide.

Preferably, the conductive coating comprises two, three or four layers of silver.

Preferably, an undercoat layer is positioned between the conductive coating and the glass plate, the undercoat layer comprising silicon, more preferably silicon and oxygen, most preferably silicon and oxygen and carbon.

Preferably, the conductive coating has sheet resistance less than 325 ohms/square, more preferably less than 20 ohms/square, most preferably less than 7 ohms/square.

Preferably, the predetermined length is less than or equal to one half of a wavelength of the predetermined frequency multiplied by a shortening factor for the pane of glass.

Preferably, the glazing further comprises an RFID transponder comprising a control unit for communication with an external device, the control unit comprising a memory for storing identification data.

Preferably, the RFID transponder is applied on a surface of the glazing, preferably attached to the surface of the glazing by a self-adhesive ply of polymer.

In a second aspect, the present invention provides a method for manufacturing a glazing comprising the steps set out in claim 12.

The invention provides a method for manufacturing a glazing according to the invention, comprising steps: providing a pane of glass; arranging a conductive coating on a surface of the pane of glass; configuring a data transmission window in or adjacent the conductive coating; wherein the data transmission window is at least partly coating-free; and forming the data transmission window to comprise a rectangular portion having a longer edge and a shorter edge; and a protrusion from the shorter edge or the longer edge wherein an axial portion of the protrusion has an axis parallel with the longer edge; and wherein the protrusion and the axial portion are coating-free; and wherein the rectangular portion comprises a plurality of horizontal coating-free lines having a spacing and a plurality of vertical coating-free lines having the same spacing to form a plurality of coated squares or a different spacing to form a plurality of coated rectangles; and wherein the spacing is chosen to allow transmission at a predetermined frequency through the data transmission window; and wherein the spacing is less than or equal to one tenth of a wavelength corresponding to the predetermined frequency multiplied by a shortening factor for the pane of glass; and wherein at least a section of the axial portion has a predetermined length greater than or equal to one sixth of a wavelength of the predetermined frequency multiplied by a shortening factor for the pane of glass.

Preferably, the method for manufacturing a glazing further comprises a step of pyrolytically depositing the conductive coating. Preferably, the coating is deposited by Chemical Vapour Deposition (CVD). Preferably, the coating is deposited during manufacture of the pane of glass.

Preferably, the method for manufacturing a glazing further comprises a step of forming the data transmission window at least partly by laser deletion of the conductive coating.

A coating-free region may be formed by masking during a coating deposition process. Alternatively, the conductive coating may be deposited and then partly removed to form a coating-free region.

Removal of conductive coating material is by any method, such as laser deletion, or mechanical abrasion. Preferably, coating-free line width is from 10 μm to 5 mm, more preferably from 20 μm to 200 μm, more preferably from 30 μm to 100 μm.

The data transmission window comprises at least one grid of coating-free lines forming a frequency selective surface (FSS) for a predetermined frequency. A plurality of horizontal coating-free lines having a predetermined spacing and a plurality of vertical coating-free lines having the same spacing form a plurality of coated squares. The spacing is chosen to allow transmission at a predetermined frequency through the data transmission window. The spacing is less than or equal to one tenth of a wavelength corresponding to the predetermined frequency, multiplied by a shortening factor for the pane of glass. For example, a predetermined frequency of 3 GHz requires a spacing of 1 cm or less, preferably 6 mm or less, due to shortening factor 0.6.

In an alternative to coated squares, the plurality of vertical coating-free lines having a different spacing form a plurality of coated rectangles. For the spacing and the different spacing, the spacing is less than or equal to one tenth of a wavelength corresponding to the predetermined frequency multiplied by a shortening factor for the pane of glass. Preferably, the spacing is larger than the different spacing.

Preferably, the lengths of the shorter edge and the longer edge of the data transmission window are similar to the width and the length respectively of an RFID transponder to be located near the data transmission window.

In a third aspect, the present invention provides use of a glazing according to the invention as a heated window of a vehicle for land, sea and air, for example as a windshield, a rear window, a side window or a roof window of a motor vehicle. The invention may also be used as a window for a building, or a window in a refrigerator door, or in street furniture. The invention may be used in the UHF band, preferably from 900 MHz to 950 MHz.

The invention will now be further disclosed by non-limiting drawings, non-limiting examples and a comparative example.

DETAILED DESCRIPTION OF THE INVENTION

Figure 1:
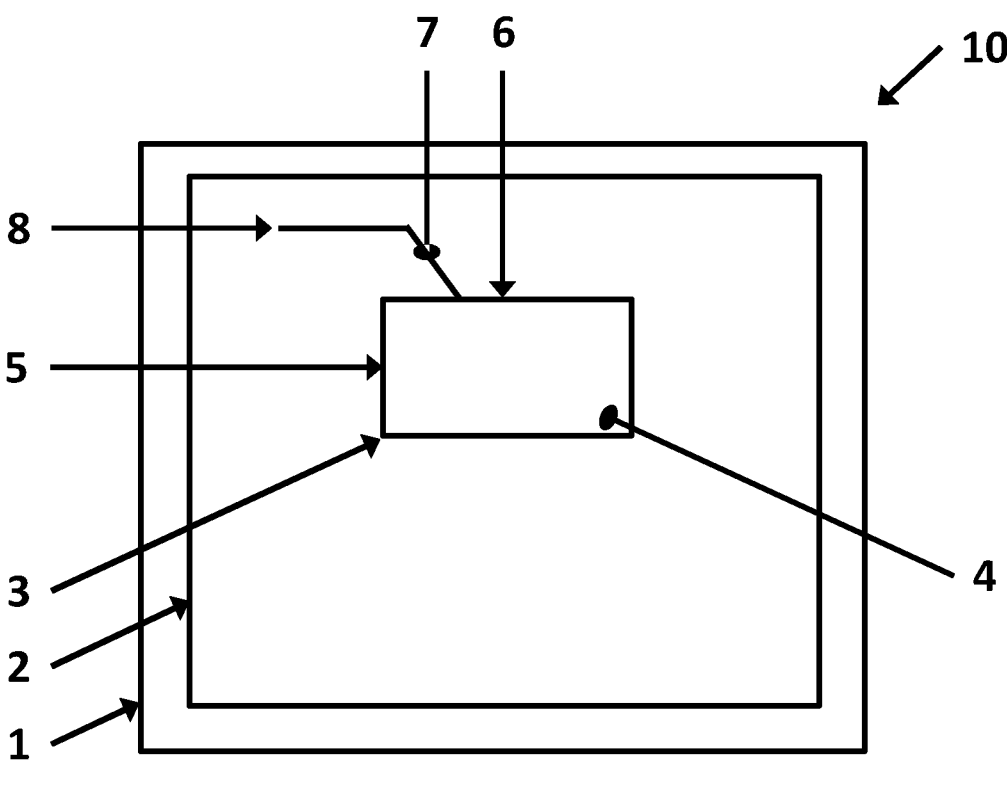
FIG. 1 is an embodiment of the invention with a protrusion from a longer edge.

FIG. 1 discloses a glazing (10) according to the invention comprising a pane of glass (1). A conductive coating (2) is arranged on a surface of the pane of glass (1) and is spaced inwardly from the periphery of the pane of glass (1).

A data transmission window (3) is in the conductive coating (2). The data transmission window (3) is at least partly coating-free to allow RF communication. For example, the data transmission window (3) may be a rectangular grid of laser deletion lines forming a frequency selective surface.

The data transmission window (3) comprises a rectangular portion (4) having a shorter edge (5) and a longer edge (6). The shape of the rectangular portion (4) is similar to the shape of an RFID transponder. The longer edge (6) is shown horizontal but may be oriented at an angle to the horizontal.

The data transmission window (3) further comprises a protrusion (7). The protrusion (7) may have any shape, for example rectangular, triangular, arcuate, linear or a bent line. The shape of the protrusion (7) in FIG. 1 is a bent line comprising a portion angled at approximately 45 degrees to the longer edge (6) up to a bend, and an axial portion (8) having an axis approximately parallel with the longer edge (6).

Figure 2:
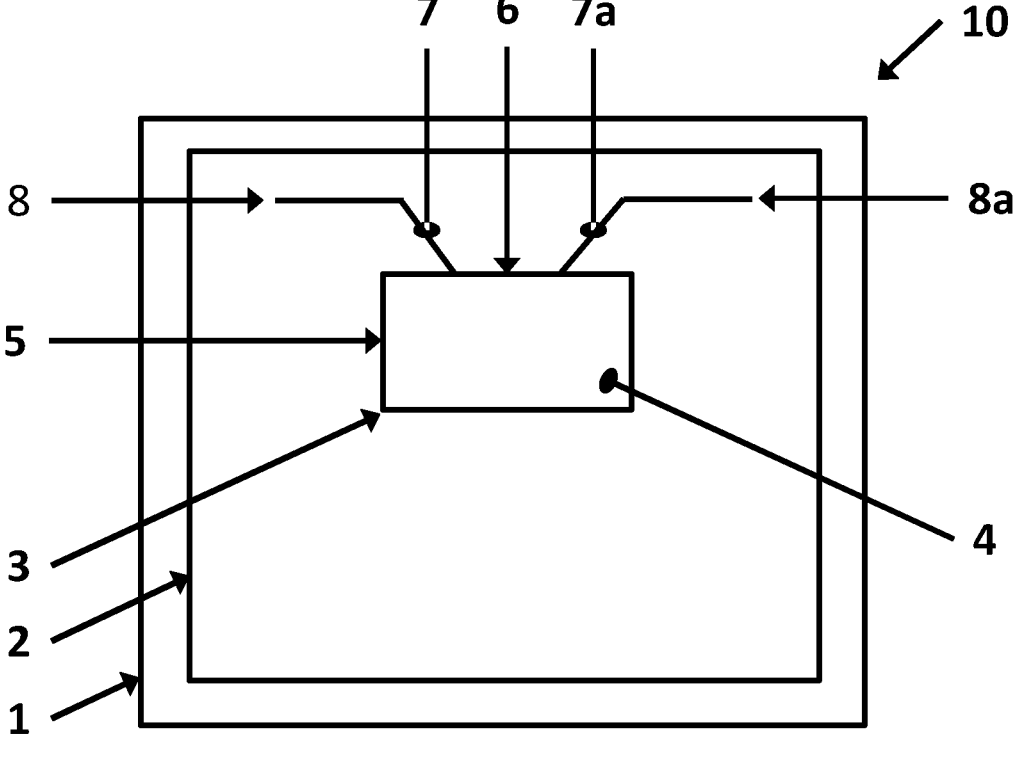
FIG. 2 is the embodiment with two protrusions from a longer edge.

FIG. 2 discloses a glazing (10) according to the invention, like FIG. 1. A first protrusion (7) extends from a longer edge (6) of a data transmission window (3), at approximately 45 degrees to the longer edge (6), up to a first bend. The first protrusion (7) has a first axial portion (8) having an axis parallel with the longer edge (6). A second protrusion (7a) extends from the longer edge (6), at approximately 45 degrees thereto, up to a second bend. The second protrusion (7a) has a second axial portion (8a) having an axis parallel with the longer edge (6). First and second axial portions (8, 8a) extend from first and second bends respectively. First and second axial portions (8, 8a) extend left and right respectively.

Figure 3:
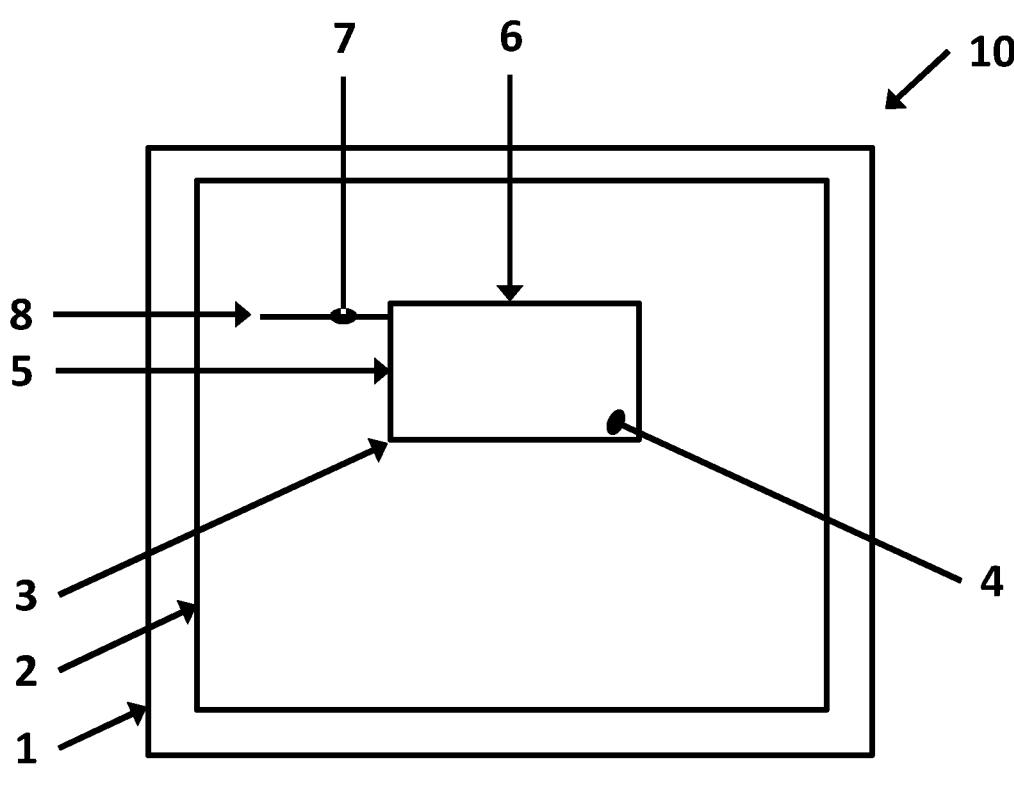
FIG. 3 is an embodiment with a protrusion from a shorter edge.

FIG. 3 discloses a glazing (10) according to the invention like FIG. 1, but the protrusion (7) extends from the shorter edge (5) of the rectangular portion (4) of the data transmission window (3). The protrusion (7) comprises an axial portion (8) having an axis parallel with the longer edge (6). The protrusion (7) shape is a straight line so the whole protrusion (7) has the same axis as the axial portion (8).

Figure 4:
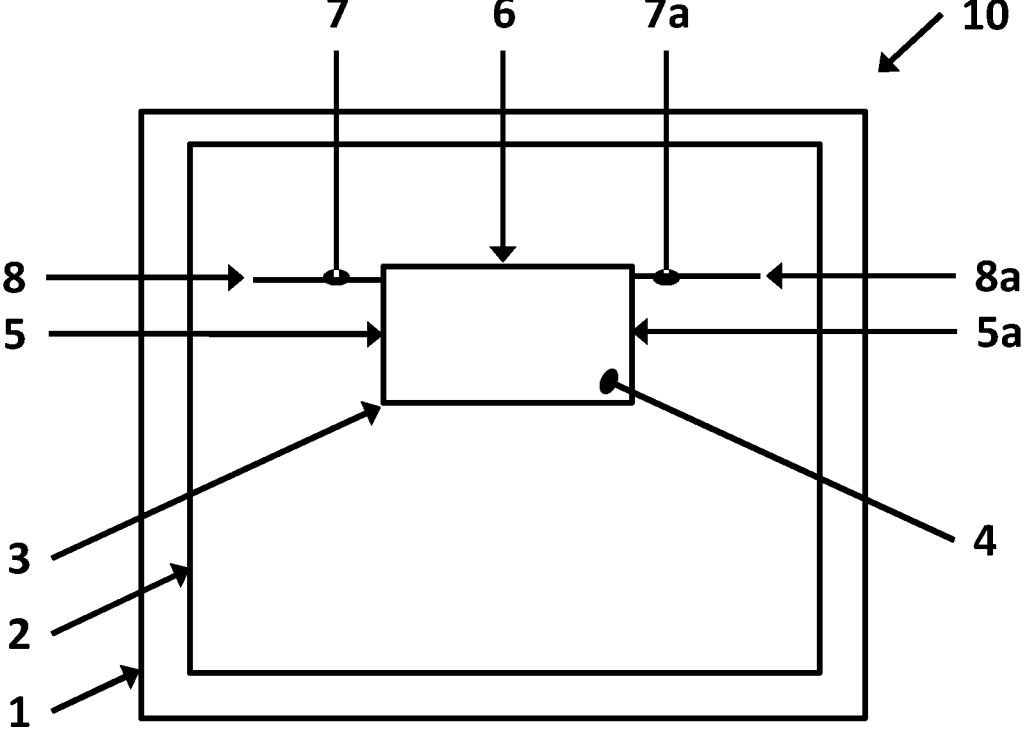
FIG. 4 is an embodiment with protrusions from two shorter edges.

FIG. 4 discloses a glazing (10) according to the invention like FIG. 3. A first protrusion (7) extends from a first shorter edge (5). A first axial portion (8) of the first protrusion (7) has an axis parallel with the longer edge (6). A second protrusion (7a) extends from a second shorter edge (5a). The second protrusion (7a) has a second axial portion (8a) having an axis parallel with the longer edge (6). First and second axial portions (8, 8a) extend left and right respectively. First and second shorter edges (5, 5a) are left and right edges respectively of the rectangular portion (4).

Figure 5:
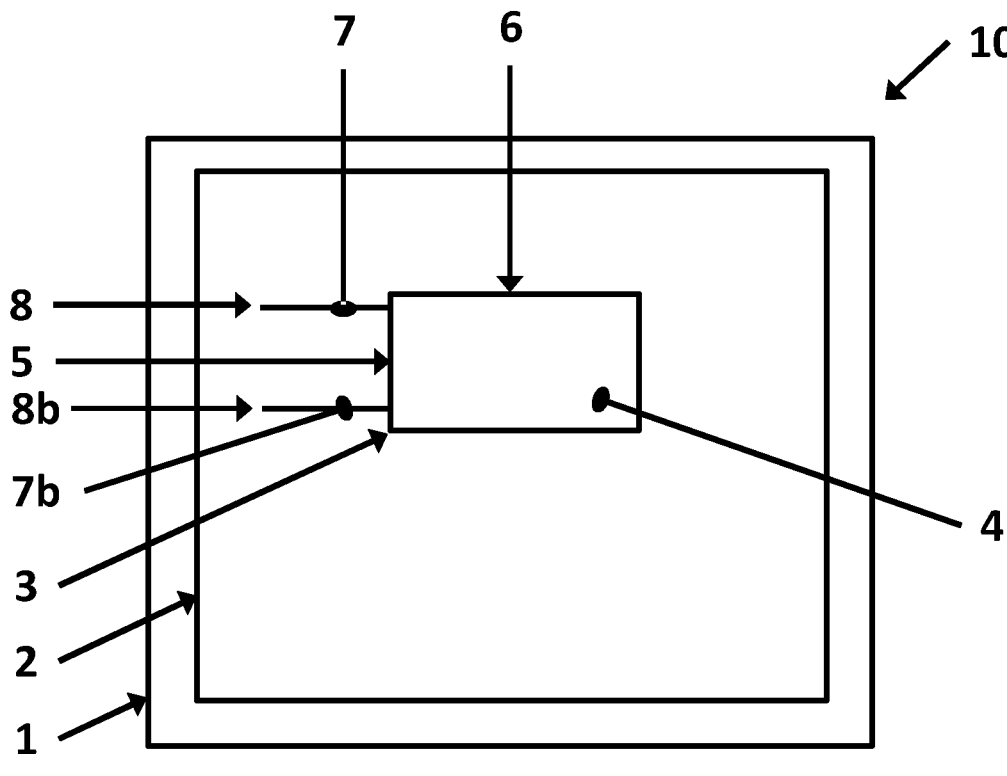
FIG. 5 is an embodiment with two protrusions from a shorter edge.

FIG. 5 discloses a glazing (10) according to the invention like FIG. 3, comprising a plurality of protrusions (7, 7b) on the first shorter edge (5). Each of the plurality of protrusions (7, 7b) extends from the first shorter edge (5) so that a first auxiliary protrusion (7b) is adjacent the first protrusion (7).

The first auxiliary protrusion (7b) has a first auxiliary axial portion (8b) having an axis parallel with the longer edge (6).

Figure 6:
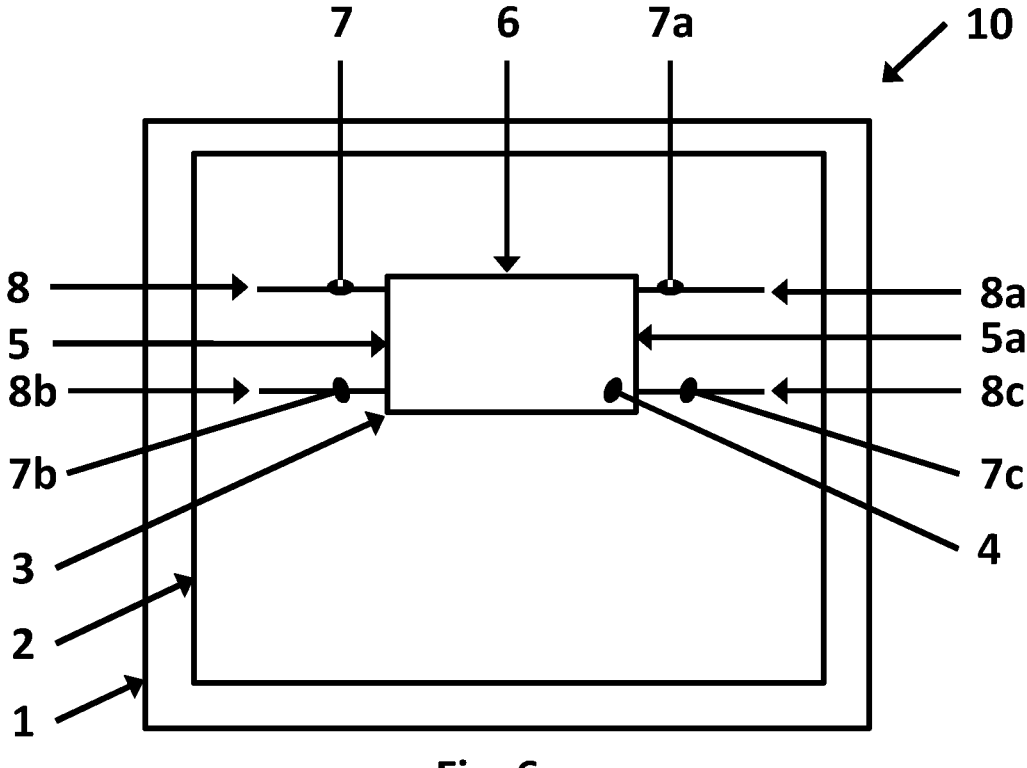
FIG. 6 is an embodiment with four protrusions from shorter edges.

FIG. 6 discloses a glazing (10) according to the invention like FIG. 5, also comprising a second protrusion (7a) and a second auxiliary protrusion (7c) on the second shorter edge (5a). The second auxiliary protrusion (7c) is adjacent the second protrusion (7a). The second protrusion (7a) has a second axial portion (8a) having an axis parallel with the longer edge (6). The second auxiliary protrusion (7c) has a second auxiliary axial portion (8c) having an axis parallel with the longer edge (6).

Figure 7:
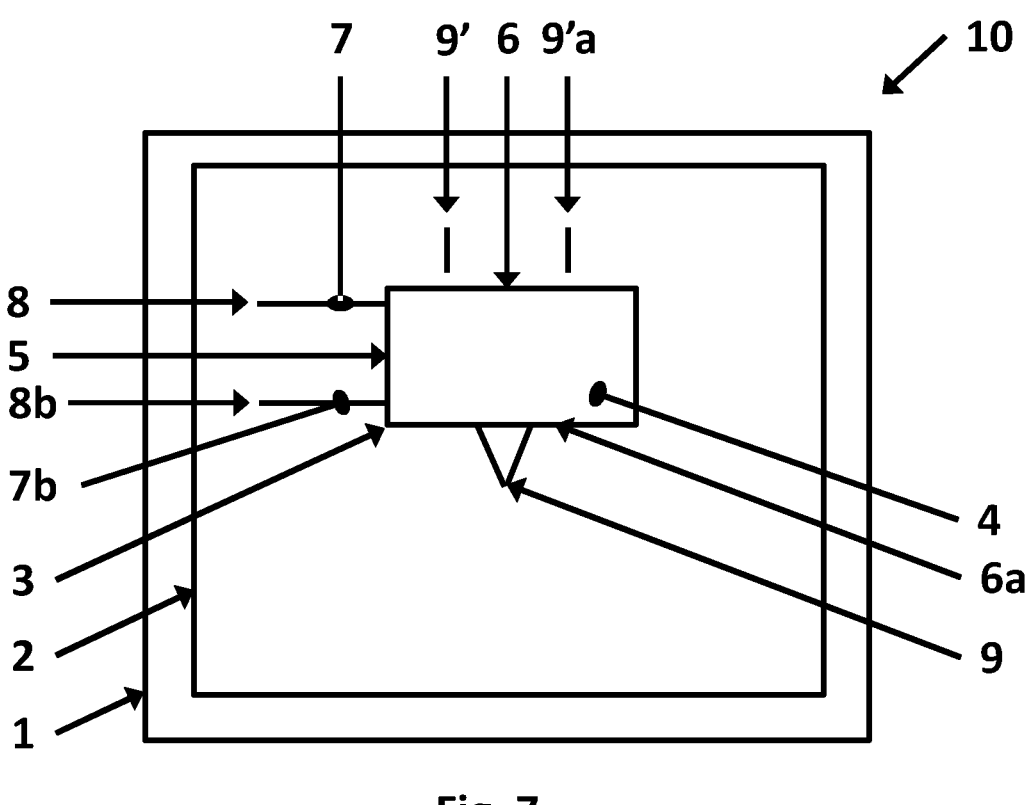
FIG. 7 is an embodiment with three protrusions and two cuts.

FIG. 7 discloses a glazing (10) according to the invention like FIG. 5, also comprising an unaligned protrusion (9) on a second longer edge (6a). Unlike a protrusion (7), the unaligned protrusion (9) does not comprise an axial portion (8) having an axis parallel with the longer edge (6).

The shape of the unaligned protrusion (9) in FIG. 7 is a triangle. The unaligned protrusion (9) may have other shapes such as a rectangle or a bent line.

The glazing (10) of FIG. 7 also comprises two cuts (9', 9'a) adjacent the longer edge (6). Unlike a protrusion (7), the cuts (9', 9'a) are not connected to the rectangular portion (4). Cuts (9', 9'a) are coating-free lines in the conductive coating (2). One or more cuts (9', 9'a) guide electric current flow in the conductive coating (2) but do not interrupt current flow at an edge (5, 5a, 6, 6a) of the rectangular portion (4).

Figure 8:
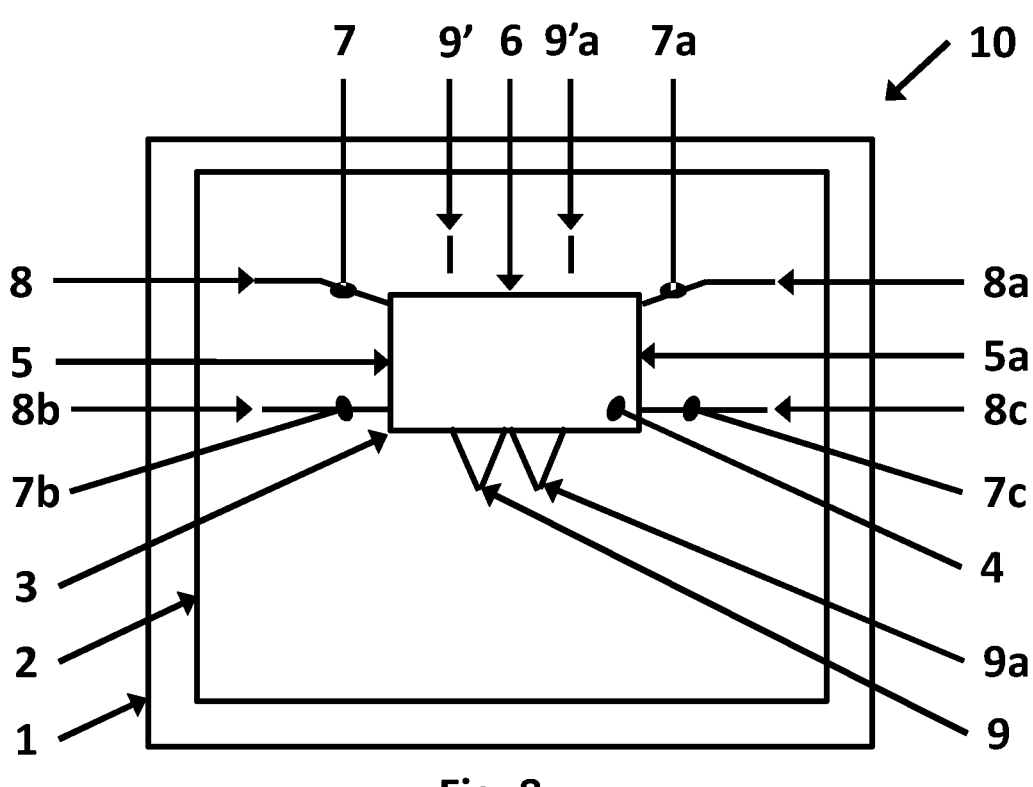
FIG. 8 is an embodiment with six protrusions and two cuts.

FIG. 8 discloses a glazing (10) according to the invention like FIG. 7, also comprising an auxiliary unaligned protrusion (9a) on the second longer edge (6a).

The glazing (10) comprises a second protrusion (7a) and a second auxiliary protrusion (7c) on the second shorter edge (5a). The second auxiliary protrusion (7c) is adjacent the second protrusion (7a). The second protrusion (7a) has a second axial portion (8a) having an axis parallel with the longer edge (6). The second auxiliary protrusion (7c) has a second auxiliary axial portion (8c) having an axis parallel with the longer edge (6).

The shape of the protrusion (7) in FIG. 8 is a bent line comprising a portion angled at approximately 40 degrees to the longer edge (6) up to a bend, and an axial portion (8) having an axis approximately parallel with the longer edge (6). The shape of the second protrusion (7a) in FIG. 8 is a bent line comprising a portion angled at approximately 40 degrees to the longer edge (6) up to a bend, and a second axial portion (8a) having an axis approximately parallel with the longer edge (6).

Figure 9:
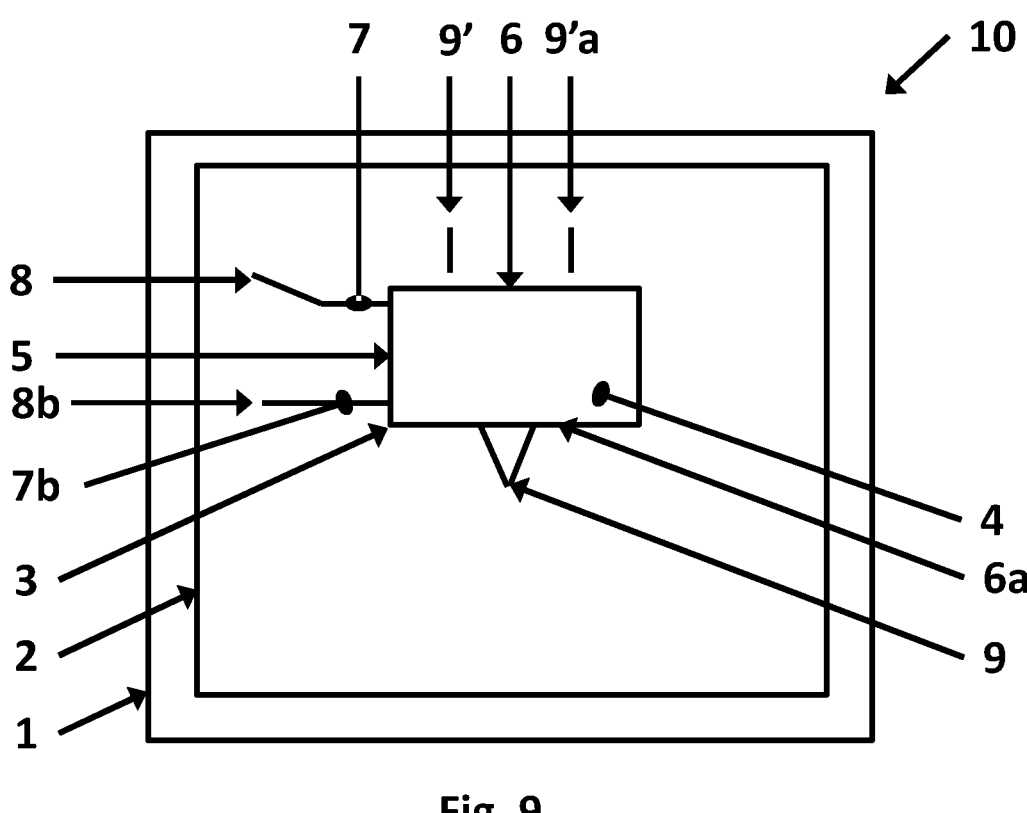
FIG. 9 is an embodiment as FIG. 7 but with an axial portion at an angle.

FIG. 9 discloses a glazing (10) according to the invention like FIG. 7, wherein the shape of the protrusion (7) is a bent line, the axial portion (8) having an axis approximately parallel with the longer edge (6) with an angular tolerance +30 degrees.

Figure 10:
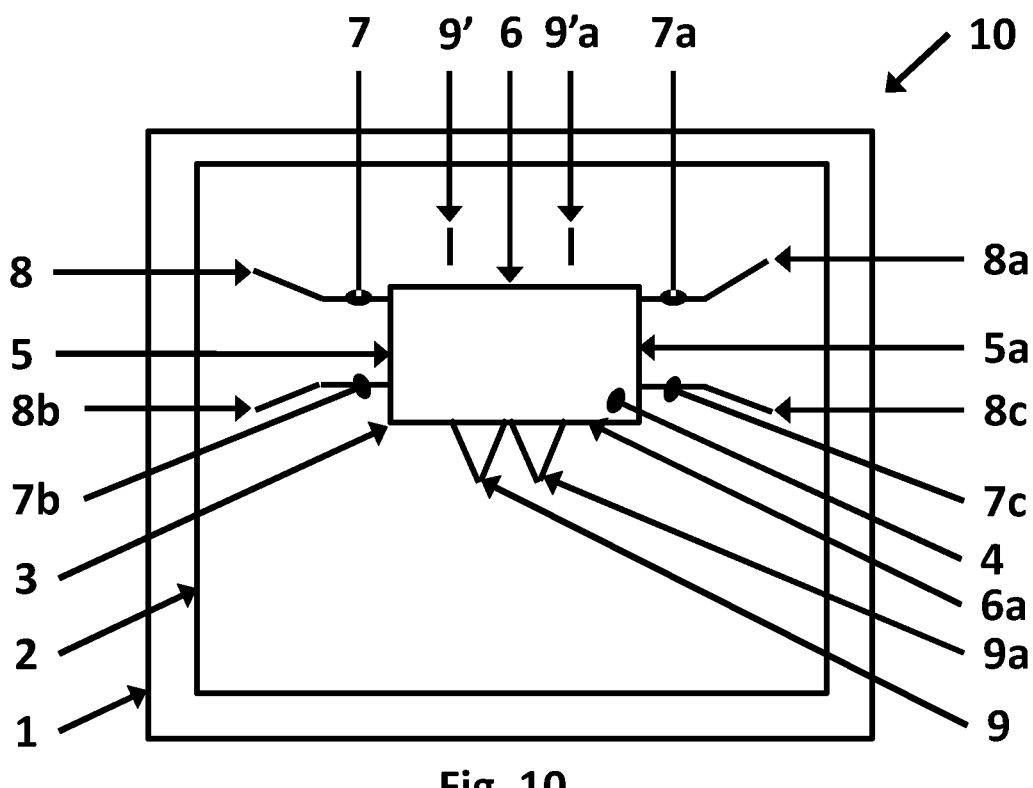
FIG. 10 is an embodiment as FIG. 8 but with four axial portions at an angle.

FIG. 10 discloses a glazing (10) according to the invention like FIG. 8, wherein the shape of the second protrusion (7a) is a bent line, the axial portion (8a) having an axis approximately parallel with the longer edge (6) with an angular tolerance +30 degrees.

Figure 11:
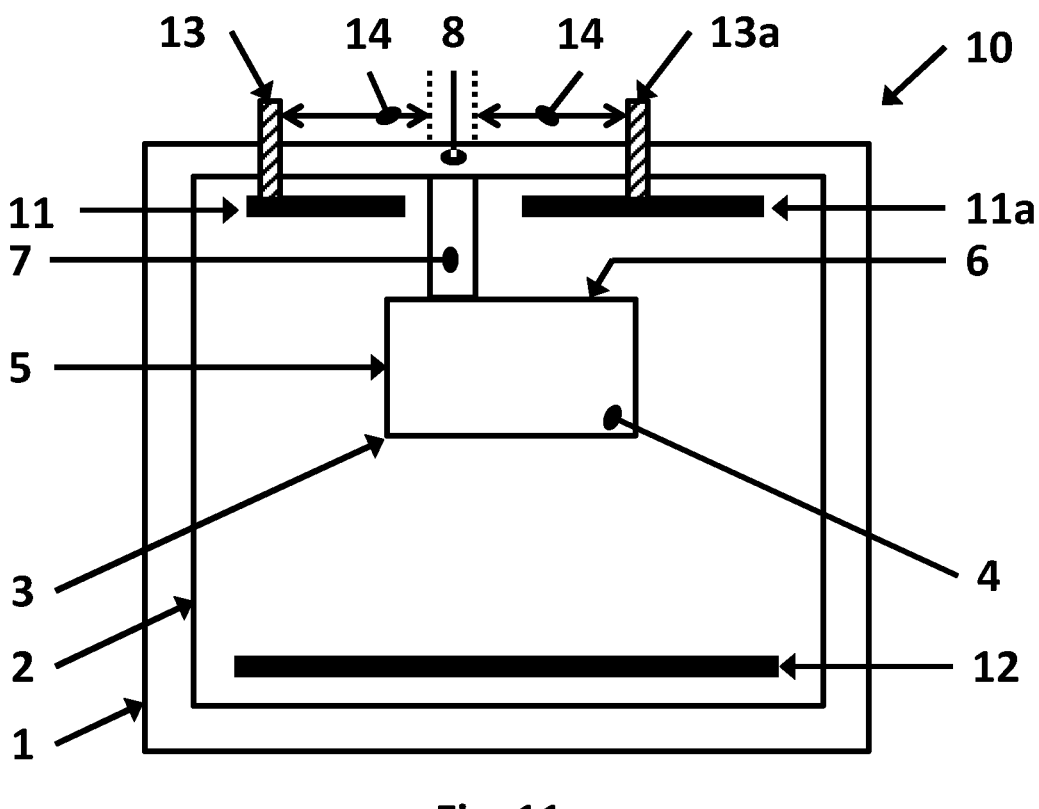
FIG. 11 is an embodiment with an axial portion at a peripheral region.

FIG. 11 discloses a glazing (10) according to the invention like FIG. 1, wherein the shape of the protrusion (7) is a rectangle, i.e. a second rectangular portion of the protrusion (7), and an axial portion (8) having an axis parallel with the longer edge (6). The axial portion (8) is formed in a coating-free region at the periphery of the pane of glass, where the conductive coating (2) has been removed. A peripheral coating-free region prevents corrosion.

The glazing (1) of FIG. 11 also comprises a first busbar (11) an auxiliary first busbar (11a) and a second busbar (12) for supplying electrical current to the conductive coating (2).

The first busbar (11) and the auxiliary first busbar (11*a*) are positioned at left and right sides of the second rectangular portion of the protrusion (7) and extend parallel with the axial portion (8). The first busbar (11) is connected to an external supply by a supply conductor (13) and the auxiliary first busbar (11*a*) is connected to an external supply by an auxiliary supply conductor (13*a*).

The supply conductor (13) and the auxiliary supply conductor (13*a*) serve as left and right ends respectively of the axial portion (8). A left section of the axial portion (8) between the supply conductor (13) and the second rectangular portion of the protrusion (7) has a predetermined length (14). A right section of the axial portion (8) between the auxiliary supply conductor (13*a*) and the second rectangular portion of the protrusion (7) has a predetermined length (14). The predetermined length (14) is a quarter wavelength of a predetermined frequency, multiplied by a shortening factor for the pane of glass (1).

Figure 12:
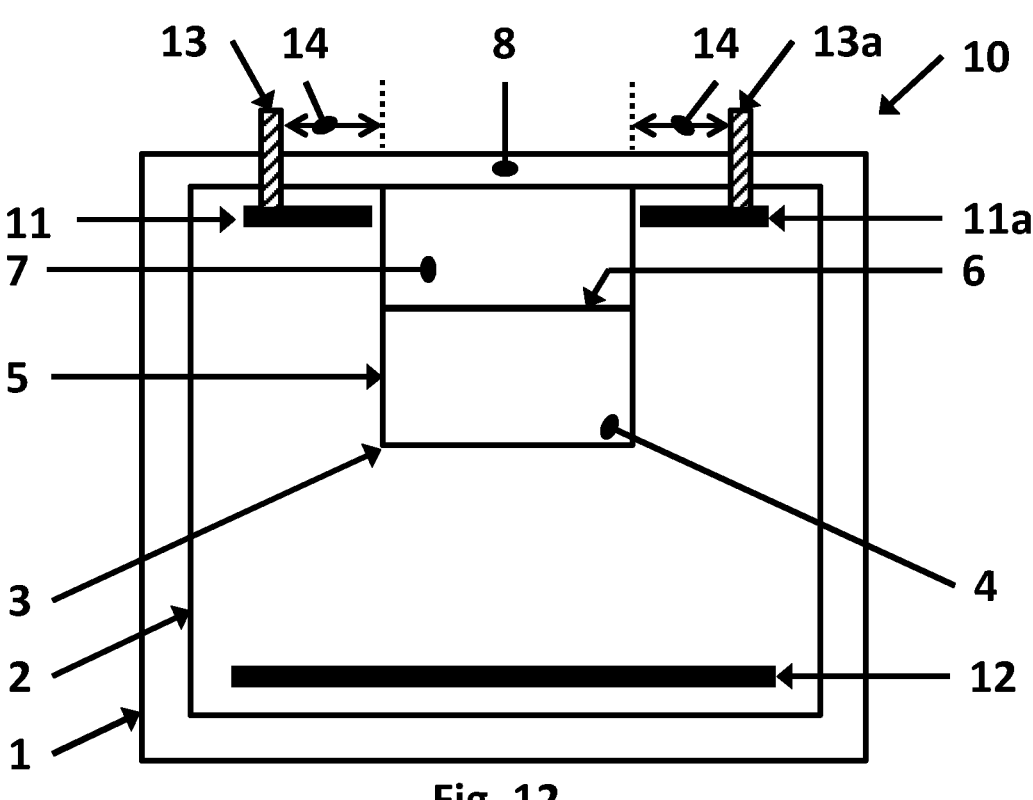
FIG. 12 is an embodiment as FIG. 11 but with a full width protrusion.

FIG. 12 discloses a glazing (10) according to the invention like FIG. 10, wherein the second rectangular portion of the protrusion (7) is the full width of the rectangular portion (4), i.e. the length of the longer edge (6).

Examples and Comparative Example

An example of a glazing according to the invention and a comparative example will now be discussed with reference to use as a window of a motor vehicle having a transponder for RF communication such as an RFID transponder on or in the glazing.

The comparative example is a glazing comprising a pane of glass and a conductive coating thereon. In the conductive coating is a data transmission window comprising a rectangular portion having two shorter edges and two longer edges. Unaligned protrusions from the shorter or longer edges are provided. An RFID transponder of similar dimensions to the rectangular portion is in or on the glazing.

The example according to the invention is like the comparative example but further comprises at least one axial portion having an axis parallel with the long edge.

The at least one axial portion of the example limits electric currents around the data transmission window so that RF communication is improved, relative to the comparative example.

The example and the comparative example also have busbars to supply electric current to the conductive coating for electric heating. Resistance of the example is more than the resistance of the comparative example, so less power is available for electric heating. Surprisingly, the difference in power does not significantly affect defrosting, but the improvement in RF communication to the RFID transponder is significant.

Predetermined length (14) and spacing of coating-free lines depend on a dielectric factor of the pane of glass. To make samples or simulations, a shortening factor is estimated as 0.7 for toughened glass, 0.6 for laminated glass, or 0.5 for coated glass with coating-free lines. Samples should be tested in an anechoic chamber to measure frequencies selected. To make a prototype, sample measurements of frequencies selected should be compared with the predetermined frequency. The predetermined length (14) and the spacing of coating-free lines should be revised for the prototype according to a revised estimate of the shortening factor based on the sample measurements.

Effect of the invention is to make a data transmission window (3) larger than a rectangular portion (4) without impinging on a vision area of the glazing (10). The result is improved RF communication, with less laser deletion, and thus cheaper, than would be needed for smaller spacing. The invention avoids extending the data transmission window (3) perpendicular to the longer edge (6) of the rectangular portion (4) which would impinge on the vision area. An example of a vision area in a windshield is a region of a where a vehicle driver requires forward vision with no distracting artifacts such as slight differences in light transmission due to removed coating, or light diffraction from edges of coating.

The section of the axial portion (8) having a predetermined length (14) is the length of the axial portion (8) or the length of a section thereof not abutting a second rectangular portion of the protrusion (7). In FIG. 11 and FIG. 12 the second rectangular portion of the protrusion (7) abuts the axial portion (8) centrally so two sections of the axial portion (8) have the predetermined length (14).

KEY TO THE DRAWINGS

References in the drawings are as follows:
1—Pane of glass
2—Conductive coating
3—Data transmission window
4—Rectangular portion
5, 5*a*—Shorter edge, second shorter edge
6, 6*a*—Longer edge, second longer edge
7, 7*a*—Protrusion, second protrusion
7*b*, 7*c*—Auxiliary protrusion, second auxiliary protrusion
8, 8*a*—Axial portion, second axial portion
8*b*, 8*c*—Auxiliary axial portion, second auxiliary axial portion
9, 9*a*—Unaligned protrusion, auxiliary unaligned protrusion
9', 9'*a*—Disconnected line, auxiliary disconnected line
10—Glazing
11, 11*a*—First busbar, auxiliary first busbar
12—Second busbar
13, 13*a*—Supply conductor, auxiliary supply conductor
14—Predetermined length

The invention claimed is:
1. A glazing, comprising:
a pane of glass;
a conductive coating on a surface of the pane of glass;
a data transmission window in or adjacent the conductive coating;
wherein the data transmission window is at least partly coating-free;
wherein the data transmission window comprises:
a rectangular portion having a shorter edge and a longer edge; and
a protrusion from the shorter edge or the longer edge;
wherein the protrusion comprises:
an axial portion having an axis parallel with the longer edge; and
wherein the protrusion and the axial portion are coating-free; and
wherein the rectangular portion comprises a plurality of horizontal coating-free lines having a spacing and a plurality of vertical coating-free lines having the same spacing to form a plurality of coated squares or a different spacing to form a plurality of coated rectangles; and
wherein the spacing is chosen to allow transmission at a predetermined frequency through the data transmission window; and wherein the spacing is less than or equal to one tenth of a wavelength corresponding to the predetermined frequency multiplied by a shortening factor for the pane of glass; and at least a section of the axial portion having a predetermined length greater than or equal to one sixth of a wavelength of the predetermined frequency multiplied by a shortening factor for the pane of glass.

2. A glazing according to claim 1, comprising a plurality of protrusions.

3. A glazing according to claim 1, wherein the protrusion has a shape selected from rectangular, triangular, arcuate, linear, bent line, straight line or combinations thereof.

4. A glazing according to claim 2, wherein at least one of the protrusions comprises a plurality of axial portions each having an axis parallel with the longer edge.

5. A glazing according to claim 4, wherein at least one of the axial portions is shaped as a straight line.

6. A glazing according to claim 1, wherein the axial portion has a width in a range from 10 μm to 5 mm.

7. A glazing according to claim 1, wherein the axial portion has a length in a range from 10 to 50 mm.

8. A glazing according to claim 1, wherein the conductive coating comprises a layer of a transparent conductive oxide.

9. A glazing according to claim 1, wherein the conductive coating has sheet resistance less than 325 ohms/square.

10. A glazing according to claim 1, further comprising an RFID transponder comprising a control unit for communication with an external device, the control unit comprising a memory for storing identification data.

11. A glazing according to claim 1, wherein the predetermined length is less than or equal to one half of a wavelength of the predetermined frequency multiplied by a shortening factor for the pane of glass.

12. Use of the glazing according to claim 1 as a windshield, a rear window, a side window, or a roof window of a motor vehicle or as a for a building, or a window in a refrigerator door, or in street furniture.

13. A glazing according to claim 1, wherein the axial portion has a width in a range from 30 μm to 200 μm.

14. A glazing according to claim 1, wherein the axial portion has a length in a range from 25 to 35 mm.

15. A glazing according to claim 1, wherein the conductive coating comprises a layer of a doped transparent conductive oxide.

16. A glazing according to claim 1, wherein the conductive coating has sheet resistance less than 7 ohms/square.

17. A glazing according to claim 1, wherein the axial portion is shaped as a straight line.

18. A method for manufacturing a glazing, comprising:
providing a pane of glass;
depositing a conductive coating on a surface of the pane of glass;
forming a data transmission window in or adjacent the conductive coating;
wherein the data transmission window is at least partly coating-free;
wherein the data transmission window comprises:
a rectangular portion having a shorter edge and a longer edge; and
a protrusion from the shorter edge or the longer edge;
wherein the protrusion comprises:
an axial portion having an axis parallel with the longer edge; and
wherein the protrusion and the axial portion are coating-free; and
wherein the rectangular portion comprises a plurality of horizontal coating-free lines having a spacing and a plurality of vertical coating-free lines having the same spacing to form a plurality of coated squares or a different spacing to form a plurality of coated rectangles; and
wherein the spacing is chosen to allow transmission at a predetermined frequency through the data transmission window; and
wherein the spacing is less than or equal to one tenth of a wavelength corresponding to the predetermined frequency multiplied by a shortening factor for the pane of glass; and
at least a section of the axial portion having a predetermined length greater than or equal to one sixth of a wavelength of the predetermined frequency multiplied by a shortening factor for the pane of glass.

19. A method for manufacturing a glazing according to claim 18, further comprising pyrolytically depositing the conductive coating during manufacture of the pane of glass.

20. A method for manufacturing a glazing according to claim 18, further comprising forming the data transmission window at least partly by laser deletion of the conductive coating.

* * * * *